United States Patent
Sim et al.

(10) Patent No.: US 10,939,556 B1
(45) Date of Patent: Mar. 2, 2021

(54) ELECTRONIC COMPONENT EMBEDDED SUBSTRATE

(71) Applicant: SAMSUNG ELECTRO-MECHANICS CO., LTD., Suwon-si (KR)

(72) Inventors: Jae Sung Sim, Suwon-si (KR); Ho Hyung Ham, Suwon-si (KR); Won Seok Lee, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 0 days.

(21) Appl. No.: 16/803,298

(22) Filed: Feb. 27, 2020

(30) Foreign Application Priority Data

Dec. 16, 2019 (KR) .................. 10-2019-0167955

(51) Int. Cl.
*H05K 1/18* (2006.01)
*H01L 23/538* (2006.01)
*H05K 1/11* (2006.01)

(52) U.S. Cl.
CPC ......... *H05K 1/185* (2013.01); *H01L 23/5383* (2013.01); *H01L 23/5386* (2013.01); *H01L 23/5389* (2013.01); *H05K 1/115* (2013.01); *H05K 2201/09827* (2013.01)

(58) Field of Classification Search
CPC .............. H05K 1/185; H05K 1/115; H05K 2201/09827; H01L 23/5389; H01L 23/5383; H01L 23/5386

USPC ........................................... 361/761
See application file for complete search history.

(56) References Cited

U.S. PATENT DOCUMENTS

| | | | |
|---|---|---|---|
| 2009/0188703 A1* | 7/2009 | Ito | H01L 24/18 174/255 |
| 2011/0216513 A1 | 9/2011 | Lee et al. | |
| 2015/0235994 A1 | 8/2015 | Ohba et al. | |
| 2016/0066428 A1* | 3/2016 | Tago | H05K 1/0298 361/764 |

FOREIGN PATENT DOCUMENTS

KR     10-1084252 B1    11/2011

* cited by examiner

*Primary Examiner* — Sherman Ng
(74) *Attorney, Agent, or Firm* — Morgan, Lewis & Bockius LLP

(57) ABSTRACT

An electronic component embedded substrate includes first insulating layer having a first through portion; a first electronic component disposed in the first through portion; a second insulating layer disposed on the first insulating layer and having a second through portion; a second electronic component disposed in the second through portion; and an insulating material covering at least a portion of each of the first electronic component and the second electronic component. The first through portion and the second through portion intersect, such that a portion of the first through portion and a portion of the second through portion overlap each other, on a plane.

19 Claims, 5 Drawing Sheets

I–I'

US 10,939,556 B1

ELECTRONIC COMPONENT EMBEDDED SUBSTRATE

CROSS-REFERENCE TO RELATED APPLICATION(S)

This application claims benefit of priority to Korean Patent Application No. 10-2019-0167955 filed on Dec. 16, 2019 in the Korean Intellectual Property Office, the disclosure of which is incorporated herein by reference in its entirety.

BACKGROUND

The present disclosure relates to an electronic component embedded substrate.

In recent years, an electronic device such as a smartphone, PC, and the like has been required to have high performance and high functionality, as well as miniaturization and thinning of the overall size of the electronic device. Accordingly, the number of electronic components to be mounted on a printed circuit board is increasing, but the number of electronic components that can be mounted on the surface of the printed circuit board is limited. Therefore, a technology for electronic component embedded substrates embedding electronic components, such as passive elements and active elements in a printed circuit board, has been developed.

SUMMARY

An aspect of the present disclosure is to provide an electronic component embedded substrate capable of miniaturizing a product and increasing the number of electronic components that can be embedded therein.

Another aspect of the present disclosure is to provide an electronic component embedded substrate capable of minimizing an electrical connection path.

According to an aspect of the present disclosure, an electronic component embedded substrate may include: a first insulating layer having a first through portion; a first electronic component disposed in the first through portion; a second insulating layer disposed on the first insulating layer and having a second through portion; a second electronic component disposed in the second through portion; and an insulating material covering at least a portion of each of the first electronic component and the second electronic component. The first through portion and the second through portion may intersect, such that a portion of the first through portion and a portion of the second through portion overlap each other, on a plane.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
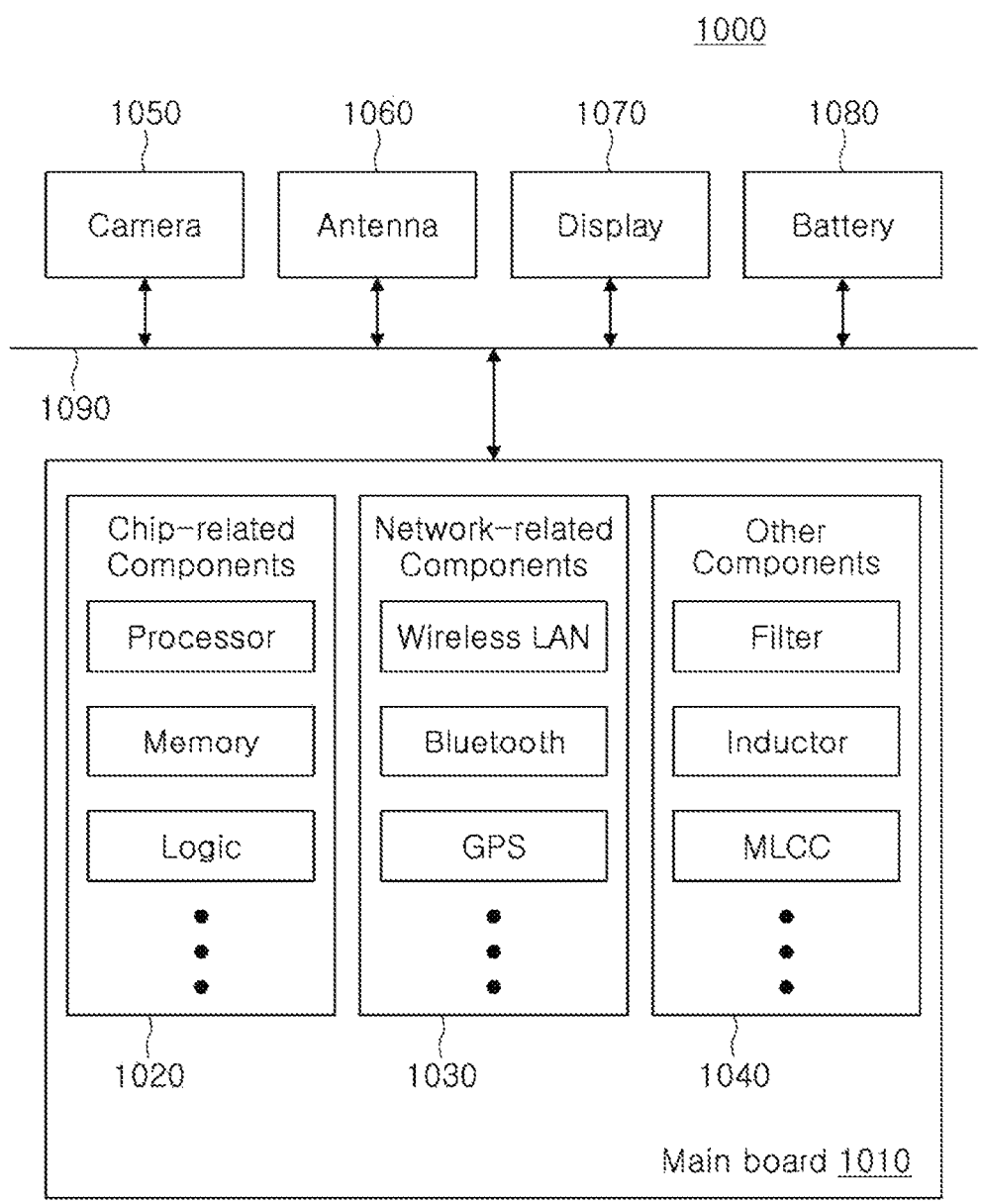
FIG. 1 is a schematic view illustrating an example of a block diagram of an electronic device system according to an example.

Hereinafter, embodiments of the present disclosure will be described with reference to the accompanying drawings. In the drawings, shapes, sizes, and the like, of elements may be exaggerated or briefly illustrated for clarity of description.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
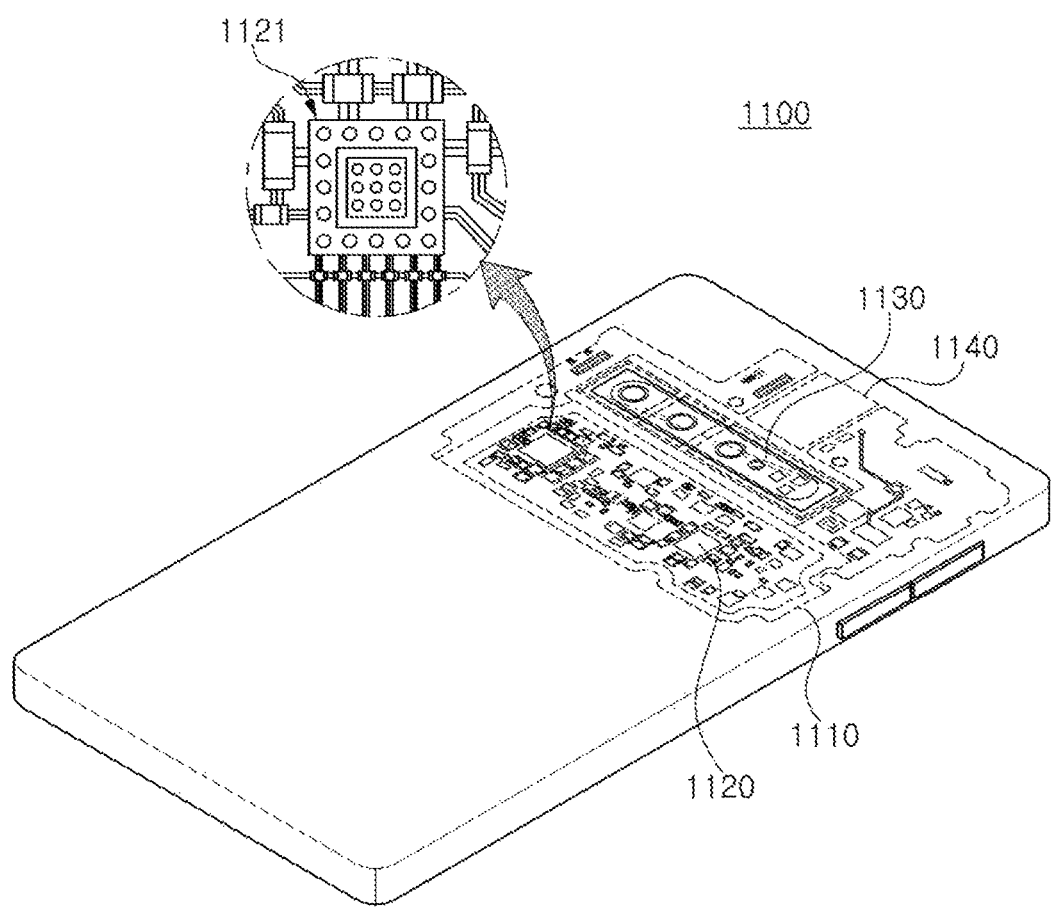
FIG. 2 is a schematic perspective view illustrating an electronic device according to an example.

FIG. 2 is a schematic perspective diagram illustrating an example of an electronic device.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other components that may or may not be physically or electrically connected to the printed circuit board 1110, such as a camera module 1130 and/or a speaker 1140, may be accommodated in the mainboard 1110. A portion of the electronic components 1120 may be chip related components, for example, a semiconductor package 1121, but are not limited thereto. The semiconductor package 1121 may be a surface mounted type, such as a semiconductor chip or a passive component on a package board of a multilayer printed circuit board, but is not limited thereto. Meanwhile, the electronic device is not necessarily limited to the smartphone 1100, but may be other electronic devices as described above.

Electronic Component Embedded Substrate

Figure 3:
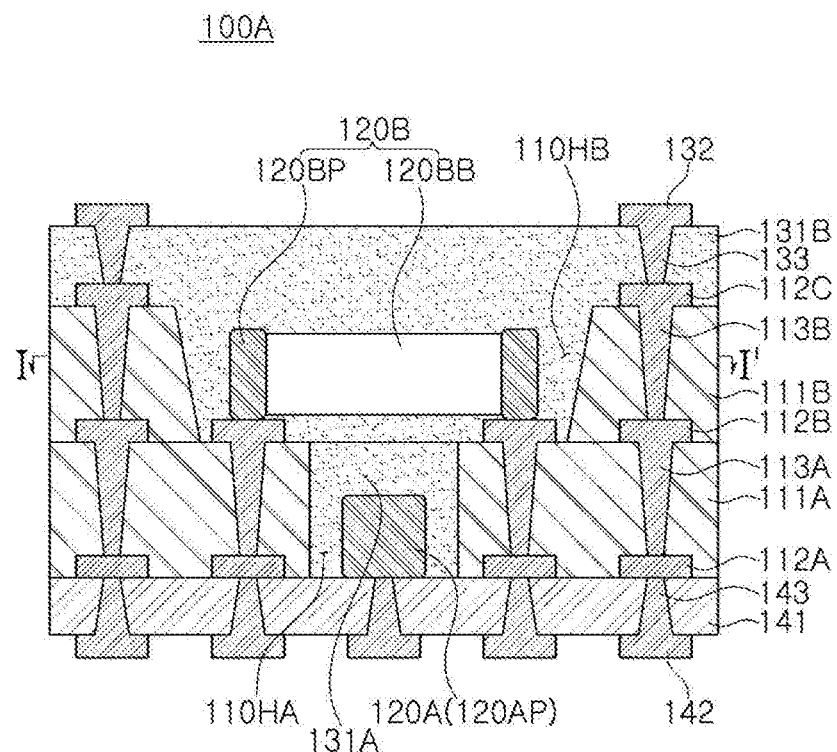
FIG. 3 is a schematic cross-sectional view of an electronic component embedded substrate 100A according to an example.
Figure 4:
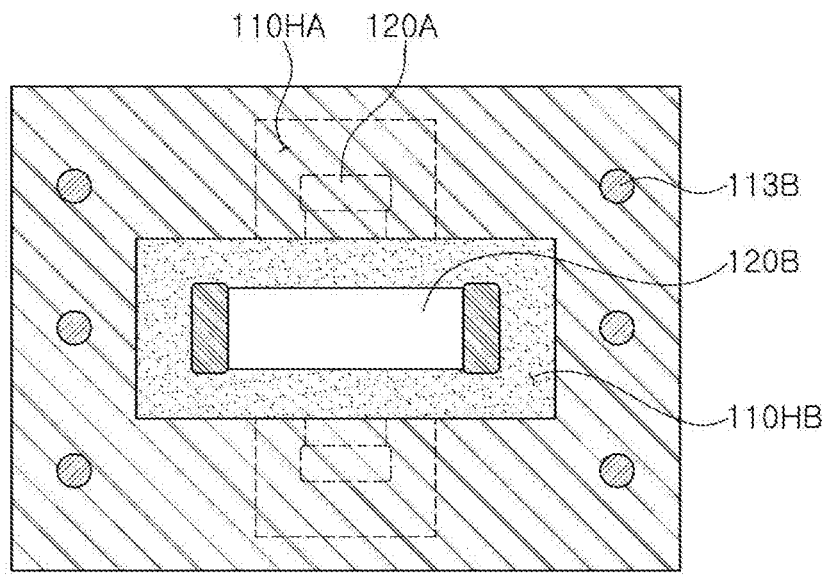
FIG. 4 is a schematic cross-sectional plan view taken along line I-I' of the electronic component embedded substrate 100A according to an example of FIG. 3.

FIG. 3 is a schematic cross-sectional view of an electronic component embedded substrate 100A according to an example. In addition, FIG. 4 is a schematic cross-sectional plan view taken along line I-I' of the electronic component embedded substrate 100A according to the example of FIG. 3.

Referring to FIG. 3, an electronic component embedded substrate 100A according to an example may include a first insulating layer 111A having a first through portion 110HA, a second insulating layer 111B disposed on the first insulating layer 111A and having a second through portion 110HB, a first electronic component 120A disposed in a plurality of wiring layers 112A to 112C and the first through portion 110HA and connected to the plurality of wiring layers 112A to 112C, a first insulating material 131A covering at least a portion of the first electronic component 120A, a second electronic component 120B disposed in the second through portion 110HB and connected to the plurality of wiring layers 112A to 112C, and a second insulating material 131B covering at least a portion of the second electronic component 120B.

The plurality of wiring layers 112A to 112C may include first to third wiring layers. The first wiring layer 112A may be disposed on a lower surface of the first insulating layers 111A, and the second wiring layer 112B may be disposed on an upper surface of the second insulating layer 111B. Based on the second insulating layer 111B, the second wiring layer 112B may be disposed on a lower surface of the second insulating layer 111B, and the third wiring layer 112C may be disposed on an upper surface of the second insulating layer 111B.

The electronic component embedded substrate 100A according to an example may further include a first via 113A penetrating the first insulating layer 111A and connecting the first wiring layer 112A and the second wiring layer 112B to each other, and a second via 113B penetrating the second insulating layer 111B and connecting the second wiring layer 112B and the third wiring layer 112C to each other.

The electronic component embedded substrate 100A according to an example may further include a fourth wiring layer 132 disposed on the second insulating material 131B, and a third via 133 penetrating a portion of the second insulating material 131B and connecting the third wiring layer 112C and the fourth wiring layer 132 to each other.

The electronic component embedded substrate 100A according to an example may further include a third insulating layer 141 disposed on the first insulating layer 111A and the first insulating material 131A, a fifth wiring layer 142 disposed on the third insulating layer, and a fourth via 143 penetrating the third insulating layer 141 and connecting the fifth wiring layer 142 to the first wiring layer 112A and/or the first electronic component 120A.

Meanwhile, the first through portion 110HA and the second through portion 110HB may cross each other on a plane. In one example, the first through portion 110HA and the second through portion 110HB may cross each other in a plan view in which the first through portion 110HA and the second through portion 110HB are superimposed on one another along a thickness direction of the electronic component embedded substrate 100A. For example, the first through portion 110HA and the second through portion 110HB may have an X or a cross shape, substantially perpendicular to each other on a plane. In the present specification, substantially vertical purposefully includes an error range that may be applied by a person skilled in the art as well as a case where an angle is entirely 90 degrees. Therefore, at least a portion of each of the first through portion 110HA and the second through portion 110HB may overlap with each other on a plane, and the portions overlapping with each other may be central portions of each of the first through portion 110HA and the second through portion 110HB. In this case, each of the first through portion 110HA and the second through portion 110HB may have a rectangular shape on a plane, but is not limited thereto.

In addition, at least a portion of each of the first through portion 110HA and the second through portion 110HB may be connected to continuously penetrate the first insulating layer 111A and the second insulating layer 111B. That is, a portion of the first through portion 110HA penetrating the first insulating layer 111A may overlap a portion of the second through portion 110HB penetrating the second insulating layer 111B. In this case, a region in which the first through portion 110HA and the second through portion 110HB overlap on a plane may have a rectangular shape, or the like.

In a cross-section thereof, a width of each of the first through portion 110HA and the second through portion 110HB may be different from each other. For example, in any one cross-section thereof, the first through portion 110HA may be wider than the second through portion 110HB, and in another cross-section thereof, the first through portion 110HA may be narrower than the second through portion 110HB.

Each of the first electronic component 120A and the second electronic component 120B disposed in each of the first through portion 110HA and the second through portion 110HB may also intersect, such that a portion of each of the first through portion 110HA and the second through portion 110HB overlap each other on a plane. For example, the first electronic component 120A and the second electronic component 120B may be substantially perpendicular to each other and may have an X or a cross shape. That is, the first electronic component 120A and the second electronic component 120B may be vertically disposed in a top-bottom direction. In this case, a central portion of each of the first electronic component 120A and the second electronic component 120B may overlap on a plane. The central portion of each of the first electronic component 120A and the second electronic component 120B overlapping on a plane may be a portion of bodies 120AB and 120BB of each of the first electronic component 120A and the second electronic component 120B.

In addition, the second insulating layer 111B may be disposed above an end portion of the first electronic component 120A, and the first insulating layer 111A may be disposed below an end portion of the second electronic component 120B. For example, as described below, each of the first electronic component 120A and the second electronic component 120B may have a body and an electrode, and the second insulating layer 111B may be disposed above the electrode 120AP of the first electronic component 120A, and the first insulating layer 111A may be disposed below the electrode 120BP of the second electronic component 120B.

A portion of each of the first insulating layer 111A and the second wiring layer 112B may be exposed through the second through portion 110HB. Therefore, the second electronic component 120B may be disposed on the first insulating layer 111A and the second wiring layer 112B exposed through the second through portion 110HB, and connected to the second wiring layer 112B. Thereafter, the second insulating material 131B may cover the exposed first insulating layer 111A, the second wiring layer 112B, and the second electronic component 120B.

In general, in the case of the electronic component embedded substrate, an electronic component is disposed in a horizontal direction. In this case, there is a limitation in miniaturization of a product and the number of electronic components that can be embedded is limited. On the other hand, in the case of the electronic component embedded substrate 100A according to an example, an electronic component may also be disposed in a top-bottom direction, such that a product may be miniaturized and the number of electronic components that can be embedded may be increased. Therefore, it is possible to improve a degree of integration of the product.

In addition, in the case of the electronic component embedded substrate 100A according to an example, the first electronic component 120A may be directly connected to the fifth wiring layer 142 disposed below the electronic component embedded substrate through the fourth via 143. The second electronic component 120B may be directly disposed on the second wiring layer 112B. Therefore, an electrical connection path may be minimized and the performance of the product may be improved.

Hereinafter, each configuration of the electronic component embedded substrate 100A according to an example will be described in more detail.

Each of the first through portion 110HA and the second through portion 110HB may penetrate at least a portion of each of the first insulating layer 111A and the second insulating layer 111B. Each of the first insulating layer 111A and the second insulating layer 111B may be formed by a sand blast method using abrasive particles, a dry etching method using plasma, a mechanical drilling and/or a laser drilling. A portion of the first insulating layer 111A may remain on the lower surface of the first through portion 110HA. In addition, a portion of the second insulating layer 111B may remain on the lower surface of the second through portion 110HB, and in some cases, the second through portion 110HB may further penetrate a portion of the first insulating layer 111A and/or the first insulating material 131A.

Each of the first through portion 110HA and the second through portion 110HB may have various shapes according to a processing method. For example, a width of the first through portion 110HA and/or the second through portion 110HB may not be constant along a penetrating direction. That is, the first through portion 110HA and/or the second through portion 110HB may have a shape in which the width thereof is narrowed from the upper portion to the lower portion.

A formation material of each of the first insulating layer 111A and the second insulating layer 111B is not particularly limited, and any material may be used as long as it has insulating properties. For example, a thermosetting resin such as an epoxy resin, a thermoplastic resin such as a polyimide, or a resin in which these resins are impregnated with a core such as glass cloth or glass fabric together with an inorganic filler, for example, a prepreg, Ajinomoto Build-up Film (ABF), FR-4, Bismaleimide Triazine (BT), and the like can be used. If necessary, a Photo Imagable Dielectric (PID) resin may be used.

A formation material of the first insulating layer 111A and the second insulating layer 111B may be the same or different from each other. In addition, the thickness of each of the first insulating layer 111A and the second insulating layer 111B may be the same or different from each other.

The first insulating layer 111A may be thicker than the first electronic component 120A. Therefore the upper surface of the first insulating layer 111A may be located on a level higher than the upper surface of the first electronic component 120A. Therefore, the first electronic component 120A may be spaced apart from the second electronic component 120B disposed on the second wiring layer 112B by a predetermined distance. Similarly thereto, the second insulating layer 111B may be thicker than the second electronic component 120B. However, the present disclosure is not limited thereto, and the thicknesses of each of the first insulating layer 111A and the second insulating layer 111B may be substantially the same as the thicknesses of each of the first electronic component 120A and the second electronic component 120B, or may be thinner than the thicknesses of each of the first electronic component 120A and the second electronic component 120B.

In addition, the lower surface of the first insulating layer 111A may be substantially coplanar with the lower surface of the first electronic component 120A. When the first wiring layer 112A is buried in the lower surface of the first insulating layer 111A, the lower surface of the first wiring layer 112A may also be substantially coplanar with the lower surface of the first electronic component 120A. As described later, when the first wiring layer 112A is disposed on the lower surface of the first insulating layer 111A, the upper surface of the first wiring layer 112A may be substantially coplanar with the lower surface of the first electronic component 120A.

The first wiring layer 112A may be disposed on the lower surface of the first insulating layer 111A, and the second wiring layer 112B may be disposed on the upper surface of the second insulating layer 111B. Based on the second insulating layer 111B, the second wiring layer 112B may be disposed on the lower surface of the second insulating layer 112B, and the third wiring layer 112C may be disposed on the upper surface of the second insulating layer 112B.

In this case, the first wiring layer 112A may be buried in the lower surface of the first insulating layer 111A as shown in the drawing, and unlike the drawing, the first wiring layer 112A may be disposed on the lower surface of the first insulating layer 111A. The second wiring layer 112B may be buried in the lower surface of the second insulating layer 111B as shown in the drawing, and unlike the drawing, the second wiring layer 112B may be disposed on the lower surface of the second insulating layer 111B. When the second wiring layer 112B is disposed on the lower surface of the second insulating layer 111B, the second wiring layer 112B may be buried in the first insulating layer 111A. The third wiring layer 112C may also be disposed on the upper surface of the second insulating layer 111B as shown in the drawing, and unlike the drawing, the third wiring layer 112C may be buried in the upper surface of the second insulating layer 111B.

As a formation material of each of the first to third wiring layers 112A, 112B, and 112C, a conductive material such as copper (Cu), aluminum (Al), silver (Ag), tin (Sn), gold (Au), nickel (Ni), lead (Pb), titanium (Ti), or alloys thereof may be used. Each of the first to third wiring layers 112A, 112B, and 112C may perform various functions depending on designs. For example, each of the first to third wiring layers 112A, 112B, and 112C may include ground (GND) patterns layers, power (PWR) patterns, signal (S) patterns, and the like. Here, the signal (S) patterns may include various signals except for the ground (GND) signals, the power (PWR) signals, and the like, such as data signals, and the like. In addition, via pads, and the like are included.

A portion of the second wiring layer 112B may be exposed through the second through portion 110HB, and thus, the second electronic component 120B may be disposed on the exposed second wiring layer 112B. In this case, the second electronic component 120B may be directly disposed to be in contact with the second wiring layer 112B.

The first via 113A may penetrate the first insulating layer 111A and connect the first wiring layer 112A and the second wiring layer 112B to each other. In addition, the second via 113B may penetrate the second insulating layer 111B and connect the second wiring layer 112B and the third wiring layer 112C to each other. Therefore, electrical connection between the plurality of wiring layers 111A to 112C is possible.

As a formation material of each of the first via 113A and the second via 113B, a conductive material such as copper (Cu), aluminum (Al), silver (Ag), tin (Sn), gold (Au), nickel (Ni), lead (Pb), titanium (Ti), or alloys thereof may be used. Each of the first via 113A and the second via 113B may be completely filled with a conductive material, or the conductive material may be formed along a wall of the via. When the conductive material is formed along a wall of a via hole, an interior of the via hole may be filled with an insulating material. In addition, the shape of each of the first via 113A and the second via 113B may have all shapes known in the art, such a tapered shape, a cylindrical shape, and the like.

When the first via 113A and/or the second via 113B have a tapered shape, depending on the process, the first via 113A and/or the second via 113B may have a tapered shape, tapered in a direction opposite to that shown in the drawing. That is, the width of the width of the first via 113A and/or the second via 113B may be increased from the upper side to the lower side thereof.

In addition, when the first via 113A and/or the second via 113B have a tapered shape, the first via 113A and/or the second via 113B may have a tapered shape, tapered in a direction opposite to the fourth via 143 described later. For example, as shown in the drawing, the first via 113A and the second via 113B may have a shape in which the width thereof is narrowed from the upper portion to the lower portion thereof, and the fourth via 143 may have a shape in which the width thereof is widened from the upper portion to the lower portion thereof.

In addition, as shown in the drawing, the first via 113A may have a structure integrated with a second wiring pattern 112B connected to the first via 113A. The second via 113B may have a structure integrated with a third wiring pattern 112C connected to the second via 113B.

Each of the first electronic component 120A and the second electronic component 120B may be chip-type components having bodies 120AB and 120BB and electrodes 120AP and 120BP. For example, each of the first electronic component 120A and the second electronic component 120B may be multi-layer ceramic capacitors (MLCC).

As a formation material of the electrodes 120AP and 120BP of each of the first electronic component 120A and the second electronic component 120B, a conductive material such as copper (Cu), aluminum (Al), silver (Ag), tin (Sn), gold (Au),nickel (Ni), lead (Pb), titanium (Ti), or alloys thereof may be used. For example, when tin (Sn) is used as a formation material of the electrodes 120AP and 120BP of each of the first electronic component 120A and the second electronic component 120B, it may be fixed to the second wiring layer 112B by a reflow process.

However, the present disclosure is not limited thereto, and each of the first electronic component 120A and the second electronic component 120B may be a passive component such as an inductor, or the like, and may be an active component such a as an integrated circuit (IC) or a semiconductor chip.

The first electronic component 120A may be connected to the fifth wiring layer 142 through a fourth via 143 to be described later. In this case, the electrode 120AP of the first electronic component 120A may be directly in contact with the fourth via 143 to be connected to each other.

The second electronic component 120B may be disposed on the second wiring layer 112B. In this case, the second electronic component 120B may be directly disposed to be in contact with the second wiring layer 112B. More specifically, the electrode 120BP of the second electronic component 120B may be directly in contact with the second wiring layer 112B to be connected thereto.

The first electronic component 120A and the second electronic component 120B may be disposed to be spaced apart by a predetermined distance. A space between the first electronic component 120A and the second electronic component 120B may be filled with a first insulating material 131A and/or a second insulating material 131B.

The first insulating material 131A may cover at least a portion of the first electronic component 120A. In addition, the first insulating material 131A may fill at least a portion of the first through portion 110HA. For example, the first insulating material 131A may cover at least a portion of each of the upper surface and the side surface of the first electronic component 120A, and may fill at least a portion of the space between the first through portion 110HA and the first electronic component 120A.

The second insulating material 131B may cover at least a portion of the second electronic component 120B. In addition, the second insulating material 131B may fill at least a portion of the second through portion 110HB. For example, the second insulating material 131B may cover at least a portion of each of the upper surface and the side surface of the second electronic component 120B, and may fill at least a portion of the space between the second through portion 110HB and the second electronic component 120B. In addition, the second insulating material 131B may cover at least a portion of each of the first insulating layer 111A and the second wiring layer 112B exposed through the second through portion 110HB. In addition, the second insulating material 131B may cover at least a portion of each of the second insulating layer 111B and the third wiring layer 112C.

Depending on designs, an insulating layer, a wiring layer, and/or vias may be further disposed above the second insulating material 131B.

A formation material of each of the first insulating material 131A and the second insulating material 131B is not particularly limited, and any material may be used, as long as it has insulating properties. For example, a thermosetting resin such as an epoxy resin, a thermoplastic resin such as a polyimide, or a resin in which these resins are impregnated with a core such as glass cloth or glass fabric together with an inorganic filler, for example, a prepreg, Ajinomoto Build-up Film (ABF), FR-4, Bismaleimide Triazine (BT), and the like can be used. If necessary, a Photo Imagable Dielectric (PID) resin may be used.

Depending on the process, a boundary between the first insulating material 131A and the second insulating material 131B may not be distinguished from each other according to a material and a process of each of the first insulating material 131A and the second insulating material 131B. That is, the first insulating material 131A and the second insulating material 131B may be integrated with each other during a lamination process and a boundary therebetween may be unclear, such that it may be difficult to visually determine the boundary therebetween with a naked eye in a structure of the completed electronic component embedded substrate.

Alternatively, instead of the first insulating material 131A and the second insulating material 131B, a single insulating material integrally covering at least a portion of each of the first electronic component 120A and the second electronic component 120B, and integrally filling at least a portion of each of the first through portion 110HA and the second through portion 110HB may be used.

As a formation material of the fourth wiring layer 132, a conductive material such as copper (Cu), aluminum (Al), silver (Ag), tin (Sn), gold (Au), nickel (Ni), lead (Pb), titanium (Ti), or alloys thereof may be used. The fourth wiring layer 132 may perform various functions depending on designs. For example, the fourth wiring layer 132 may include ground (GND) patterns layers, power (PWR) patterns, signal (S) patterns, and the like. Here, the signal (S) patterns may include various signals except for the ground (GND) signals, the power (PWR) signals, and the like, such as data signals, and the like. In addition, via pads, and the like are included.

The third via 133 may penetrate a portion of the second insulating material 131B and connect the third wiring layer 112C and the fourth wiring layer 132 to each other. The third via 133 may have a structure integrated with the fourth wiring layer 132 connected thereto.

As a formation material of the third via 133, a conductive material such as copper (Cu), aluminum (Al), silver (Ag), tin (Sn), gold (Au), nickel (Ni), lead (Pb), titanium (Ti), or alloys thereof may be used. The third via 133 may be entirely filled with a conductive material, or the conductive material may be formed along a wall of the via. When the conductive material is formed along a wall of a via hole, an inside of the via hole may be filled with an insulating material. In addition, the shape of the third via 133 may have all shapes known in the art, such a tapered shape, a cylindrical shape, and the like.

The third insulating layer 141 may be disposed below the first insulating layer 111A, the first wiring layer 112A, the second electronic component 120A, and the first insulating material 131A. Depending on designs, an insulating layer, a wiring layer, and/or vias may be further disposed below the third insulating layer 141.

A formation material of the third insulating material 141 is not particularly limited, and any material may be used as long as it has insulating properties. For example, a thermosetting resin such as an epoxy resin, a thermoplastic resin such as a polyimide, or a resin in which these resins are impregnated with a core such as glass cloth or glass fabric together with an inorganic filler, for example, a prepreg, Ajinomoto Build-up Film (ABF), FR-4, Bismaleimide Triazine (BT), and the like can be used. If necessary, a Photo Imagable Dielectric (PID) resin may be used.

The thickness of the third insulating layer 141 may be thicker or thinner than the thickness of each of the first insulating layer 111A and the second insulating layer 111B. In addition, the thickness of the third insulating layer 141 may be substantially the same as the thickness of each of the first insulating layer 111A and the second insulating layer 111B.

The fifth wiring layer 142 may be disposed on the lower surface of the third insulating layer 141, and may be connected to the first wiring layer 112A and/or the first electronic component 120A. In addition, the fifth wiring layer 142 may also be connected via the first wiring layer 112A and the second wiring layer 112B. The fifth wiring layer 142 may be disposed on the lower surface of the third insulating layer 141.

As a formation material of the fifth wiring layer 142, a conductive material such as copper (Cu), aluminum (Al), silver (Ag), tin (Sn), gold (Au), nickel (Ni), lead (Pb), titanium (Ti), or alloys thereof, may be used. The third wiring layer 142 may perform various functions depending on designs thereof. For example, the fifth wiring layer 142 may include a wiring pattern such as a ground (GND) pattern, a power (PWR) pattern, a signal (S) pattern, and the like. Here, the signal (S) pattern may include various signals other than the ground (GND) pattern, the power (PWR) pattern, and the like, such as a data signal, and the like. In addition, a via pad, or the like may be included.

The fourth via 143 may penetrate the third insulating layer 141, and may connect the fifth wiring layer 142 to the first wiring layer 112A and/or the first electronic component 120A with each other. As described above, the fourth via 143 may be directly in contact with the electrode 120AP of the first electronic component 120A to be connected to each other.

As a formation material of the fourth via 143, a conductive material such as copper (Cu), aluminum (Al), silver (Ag), tin (Sn), gold (Au), nickel (Ni), lead (Pb), titanium (Ti), or alloys thereof, may be used. The fourth via 143 may be completely filled with a conductive material, or the conductive material may be formed along a wall of a via. If the conductive material is formed along a wall of a via hole, an inside of the via hole may be filled with an insulating material. In addition, the shape of the fourth via 143 may have all known shapes in the art such as a tapered shape, a cylindrical shape, or the like.

As described above, when the fourth via 143 has a tapered shape, the fourth via 143 may have a tapered shape, tapered in a direction opposite to the first via 113A and/or the second via 113B, according to the process. For example, as shown in the drawing, the first via 113A and/or the second via 113B may have a shape in which the width thereof is narrowed from the upper portion to the lower portion thereof, and the fourth via 143 may have a shape in which the width thereof is widened from the upper portion to the lower portion thereof.

Figure 5:
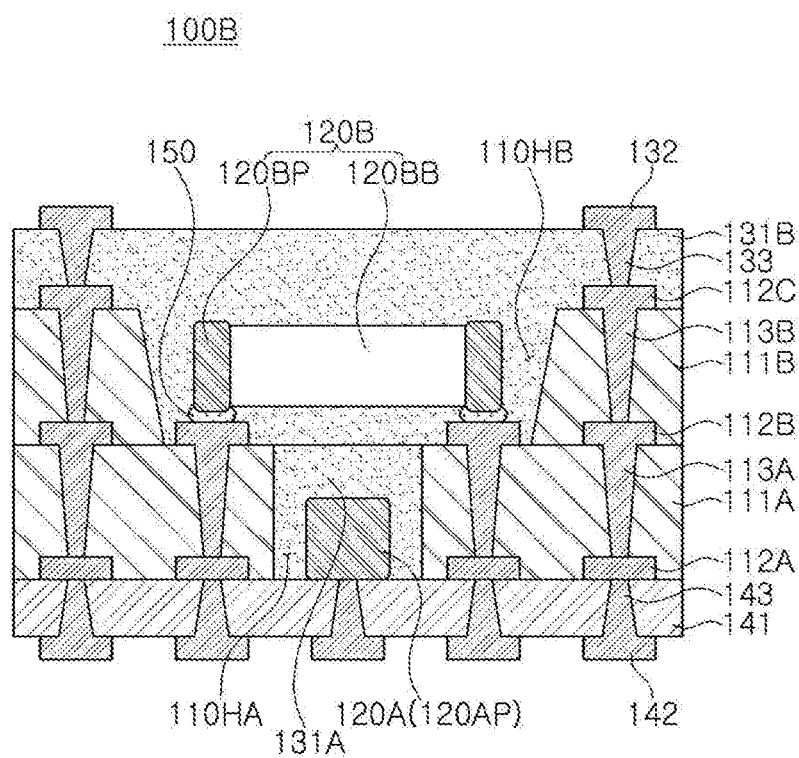
FIG. 5 is a schematic cross-sectional view illustrating an electronic component embedded substrate 100B according to another example.

FIG. 5 is a schematic cross-sectional view of an electronic component embedded substrate 100B according to another example.

As compared to the electronic component embedded substrate 100A according to an example, in the electronic component embedded substrate 100B shown in FIG. 5, the second electronic component 120B may be mounted on the second wiring layer 112B through a connection conductor 150 in a surface mounting method.

The connection conductor 150 may include a solder and/or a conductive paste. However, the present disclosure is not limited thereto, and any formation material of the connection conductor 150 may be used as long as it is a conductive material. The connection conductor 150 may also fix the second electronic component 120B to the second wiring layer 112B.

Figure 6:
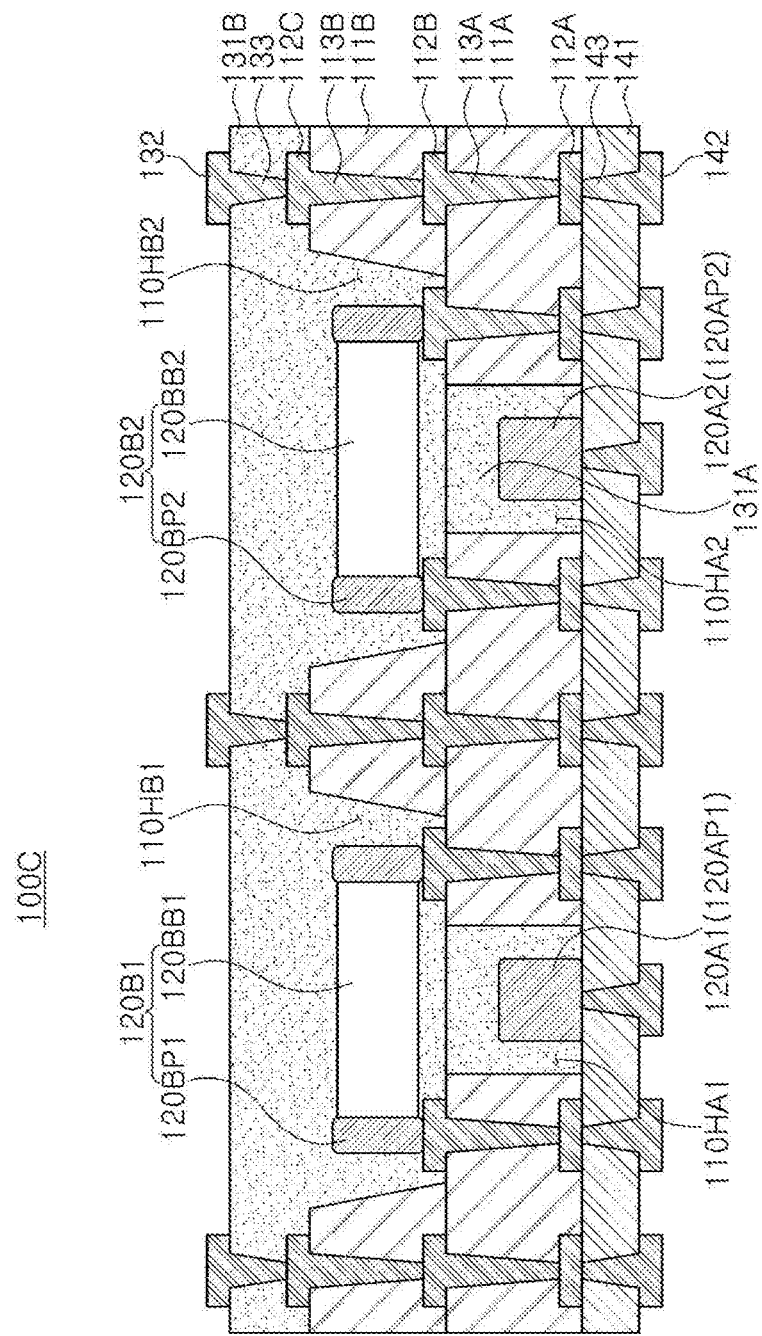
FIG. 6 is a schematic cross-sectional view illustrating an electronic component embedded substrate 100C according to another example.

FIG. 6 is a schematic cross-sectional view illustrating an electronic component embedded substrate 100C according to another example.

Referring to FIG. 6, the electronic component embedded substrate 100C according to another example may have a plurality of first through portions 110HA1 and 110HA2 and a plurality of second through portions 110HB1 and 110HB2, and include a plurality of first electronic components 120A1 and 120A2 and a plurality of second electronic components 120B1 and 120B2, as compared to the electronic component embedded substrate 100A according to an example.

Each of the plurality of first electronic components 120A1 and 120A2 may be disposed in each of the plurality of first through portions 110HA1 and 110HA2. In addition, each of the plurality of second electronic components 120B1 and 120B2 may be disposed in each of the plurality of second through portions 110HB1 and 110HB2.

However, two or more first electronic components 120A1 and 120A2 may be disposed in each of the plurality of first through portions 110HA1 and 110HA2. In addition, two or more second electronic components 120B1 and 120B2 may be disposed in each of the plurality of second through portions 110HB1 and 110HB2.

In the example embodiments, the terms "side region," "side surface," and the like, may be used to refer to a surface formed taken in right/left directions, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions.

The notion that an element is disposed on a side region, an upper side, an upper region, or a lower resin may include the configuration in which the element is directly in contact with an element configured as a reference in respective directions, and the configuration in which the element is not directly in contact with the reference element. The terms may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected."

Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

As set forth above according to the present disclosure, it is possible to provide an electronic component embedded substrate capable of miniaturizing a product and increasing the number of electronic components that can be embedded therein.

As another effect among various effects of the present disclosure, an electronic component embedded substrate capable of minimizing an electrical connection path may be provided.

While the example embodiments have been shown and described above, it will be apparent to those skilled in the art that modifications and variations could be made without departing from the scope of the present invention as defined by the appended claims.

What is claimed is:

1. An electronic component embedded substrate, comprising: a first insulating layer having a first through portion; a first electronic component disposed in the first through portion; a second insulating layer disposed on the first insulating layer and having a second through portion; a second electronic component disposed in the second through portion; and an insulating material covering at least a portion of each of the first electronic component and the second electronic component, wherein the first through portion and the second through portion intersect, such that a portion of the first through portion and a portion of the second through portion overlap each other, on a plane, wherein at least any one of the first through portion and the second through portion has a shape in which a width thereof is narrowed in a direction from the second through portion toward the first through portion.

2. The electronic component embedded substrate of claim 1, wherein the first electronic component and the second electronic component intersect in a plan view, such that a portion of the first electronic component and a portion of the second electronic component overlap each other, on a plane.

3. The electronic component embedded substrate of claim 1, wherein each of the first electronic component and the second electronic component has a body and an electrode, the second insulating layer is disposed above the electrode of the first electronic component, and the first insulating layer is disposed below the electrode of the second electronic component.

4. The electronic component embedded substrate of claim 1, wherein the insulating material comprises a first insulating material covering at least a portion of the first electronic component, and a second insulating material covering at least a portion of the second electronic component.

5. The electronic component embedded substrate of claim 1, further comprising a first wiring layer disposed on the first insulating layer, wherein the second electronic component is disposed on the first wiring layer.

6. The electronic component embedded substrate of claim 5, wherein the second electronic component is connected to the first wiring layer through a connection conductor.

7. The electronic component embedded substrate of claim 5, further comprising a second wiring layer disposed on a lower surface of the first insulating layer; and a third wiring layer disposed on an upper surface of the second insulating layer.

8. The electronic component embedded substrate of claim 7, wherein the second wiring layer is buried in the lower surface of the first insulating layer.

9. The electronic component embedded substrate of claim 7, further comprising a first via penetrating the first insulating layer, and connecting the first wiring layer and the second wiring layer to each other; and a second via penetrating the second insulating layer, and connecting the first wiring layer and the third wiring layer to each other.

10. The electronic component embedded substrate of claim 9, further comprising a third insulating layer disposed below the first insulating layer; and a fourth wiring layer disposed on a lower surface of the third insulating layer, wherein each of the first electronic component and the second electronic component is connected to the fourth wiring layer.

11. The electronic component embedded substrate of claim 10, further comprising a third via penetrating the third insulating layer and connecting the fourth wiring layer to each of the first electronic component and the second wiring layer.

12. The electronic component embedded substrate of claim 11, wherein the first electronic component comprises a body and an electrode, and the third via is in contact with the electrode of the first electronic component.

13. The electronic component embedded substrate of claim 11, wherein the third via has a tapered shape, tapered in a direction opposite to at least any one of the first via and the second via.

14. The electronic component embedded substrate of claim 1, wherein each of the first through portion and the second through portion is a plurality of first through portions and a plurality of second through portions, each of the first electronic component and the second electronic component is a plurality of first electronic components and a plurality of second electronic components, at least one or more of the plurality of first electronic components are disposed in each of the plurality of first through portions, and at least one or more of the plurality of second electronic components are disposed in each of the plurality of second through portions.

15. An electronic component embedded substrate, comprising: a first insulating layer having a first through portion; a first wiring layer disposed on the first insulating layer; a second insulating layer disposed on the first insulating layer, and having a second through portion exposing a portion of each of the first insulating layer and the first wiring layer; a first electronic component disposed in the first through portion; a second electronic component disposed in the second through portion, and connected to the first wiring layer exposed through the second through portion; and an insulating material covering at least a portion of each of the first electronic component and the second electronic component.

16. The electronic component embedded substrate of claim 15, wherein an electrode of the second electronic component is in contact with the first wiring layer.

17. The electronic component embedded substrate of claim 15, wherein an electrode of the second electronic component is spaced apart from any via of the electronic component embedded substrate.

18. The electronic component embedded substrate of claim 15, wherein the first and second electronic components are spaced apart from the insulating material.

19. An electronic component embedded substrate, comprising: a first insulating layer having a first cavity; a first electronic component disposed in a portion of the first cavity and on a level the same as a lower surface of the first insulating layer; a second insulating layer disposed on the first insulating layer and having a second cavity; a second electronic component disposed in a portion of the second cavity and on a level above a lower surface of the second insulating layer; and an insulating material covering at least a portion of each of the first electronic component and the second electronic component, wherein the first cavity and the second cavity intersect, such that the first cavity and the second cavity partially overlap each other in a plan view along a thickness direction of the substrate, wherein at least any one of the first cavity and the second cavity has a shape in which a width thereof is narrowed in a direction from the second cavity toward the first cavity.

* * * * *